(12) United States Patent
Duncan

(10) Patent No.: US 8,202,433 B2
(45) Date of Patent: Jun. 19, 2012

(54) REDUCING ADHERENCE IN A MEMS DEVICE

(75) Inventor: Walter M. Duncan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/117,754

(22) Filed: May 27, 2011

(65) Prior Publication Data

US 2011/0226732 A1  Sep. 22, 2011

Related U.S. Application Data

(62) Division of application No. 11/967,698, filed on Dec. 31, 2007, now Pat. No. 7,961,376.

(51) Int. Cl.
*C23F 1/00* (2006.01)

(52) U.S. Cl. .............................. 216/2; 216/11; 438/694

(58) Field of Classification Search ................ 216/2, 11
See application file for complete search history.

(56) References Cited

U.S. PATENT DOCUMENTS

| 5,610,438 | A | 3/1997 | Wallace et al. |
| 6,746,886 | B2 | 6/2004 | Duncan et al. |
| 6,943,950 | B2 | 9/2005 | Lee et al. |
| 7,184,201 | B2 | 2/2007 | Duncan |
| 2006/0024880 | A1* | 2/2006 | Chui et al. ............ 438/222 |
| 2006/0113618 | A1* | 6/2006 | Reboa ................ 257/415 |

* cited by examiner

*Primary Examiner* — Roberts Culbert
(74) *Attorney, Agent, or Firm* — Charles A. Brill; Wade J. Brady, III; Frederick J. Telecky, Jr.

(57) ABSTRACT

In one embodiment, an apparatus for reducing adherence in a micro-electromechanical system (MEMS) device comprises a substrate. A MEMS is disposed outwardly from the substrate. The MEMS comprises structures and corresponding landing pads. Dibs are disposed outwardly from the substrate. Each dib has a surface with depressions. An adherence-reducing material is disposed within each depression. The adherence-reducing material reduces adherence between at least a portion of a structure and a corresponding landing pad.

9 Claims, 2 Drawing Sheets

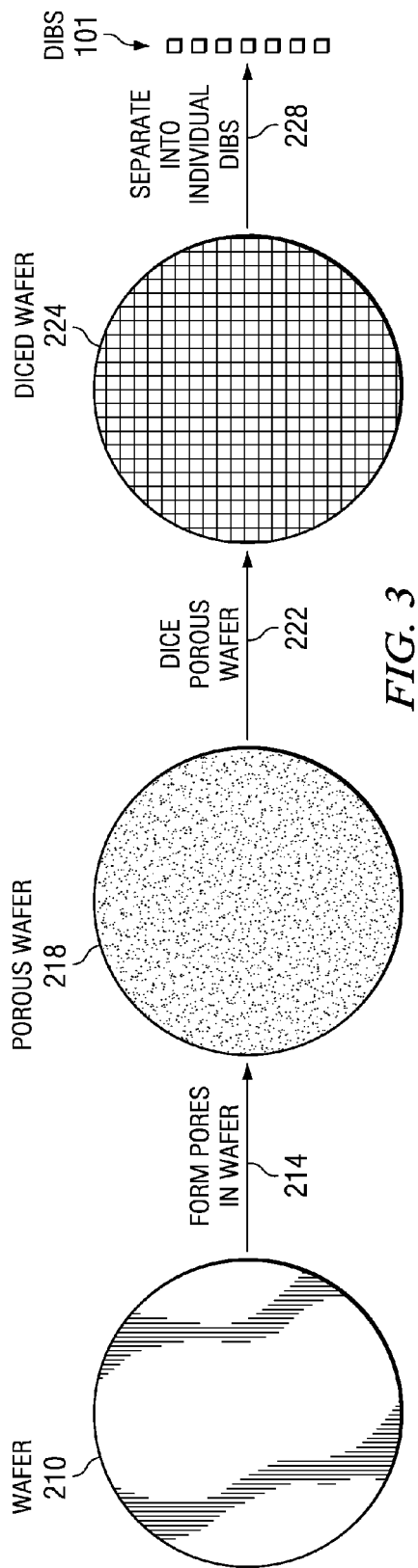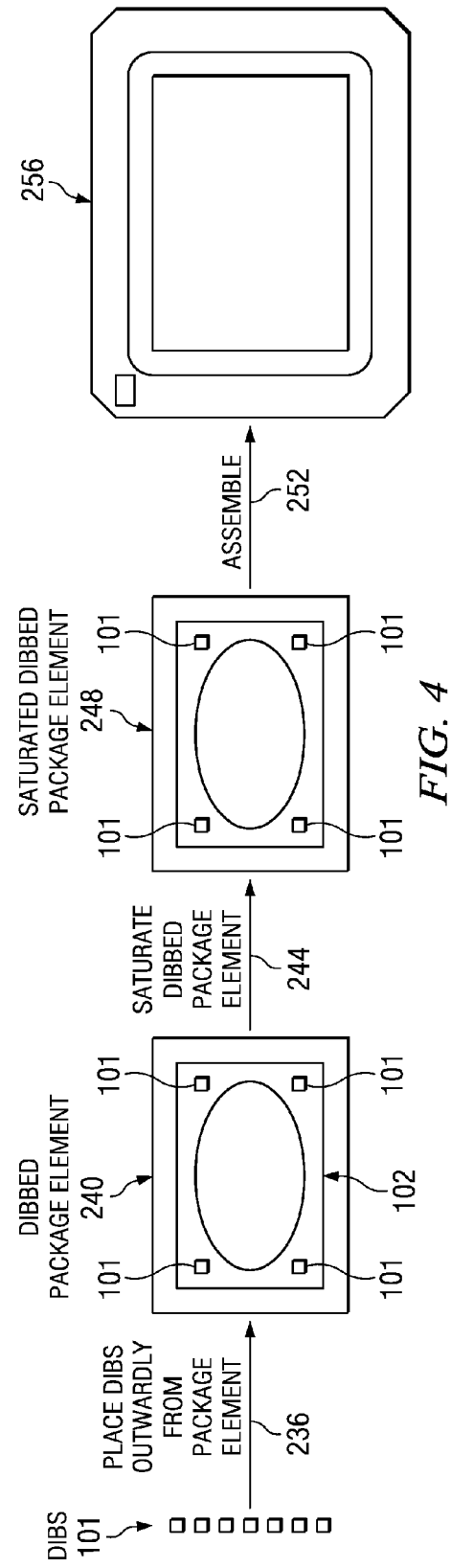

REDUCING ADHERENCE IN A MEMS DEVICE

This application is a divisional of application Ser. No. 11/967,698, filed Dec. 31, 2007.

TECHNICAL FIELD

This invention relates generally to the field of MEMS devices and more specifically to reducing adherence in a MEMS device.

BACKGROUND

Spatial light modulators may be used in optical communication and/or video display systems. In some applications, spatial light modulators may generate an image by controlling individual elements to manipulate light in order to form an image. One example of a spatial light modulator is a Digital Micromirror Device (DMD) made by TEXAS INSTRUMENTS INCORPORATED. A DMD chip typically includes an array of micromirrors that move to manipulate light.

In certain cases, material such as passivants, surfactants, and/or getters are used with a digital micromirror device to aid movement of the micromirrors. Known techniques for dispersing this material, however, may be unstable under certain conditions. For example, a molecular sieve embedded in an organic binder may be used to dispense or getter various materials. This technique, however, may be chemically and thermally unstable under processing and operating conditions.

SUMMARY OF THE DISCLOSURE

In accordance with the present invention, disadvantages and problems associated with previous techniques for reducing adherence in a MEMS device may be reduced or eliminated.

In one embodiment, an apparatus for reducing adherence in a micro-electromechanical system (MEMS) device comprises a substrate. A MEMS is disposed outwardly from the substrate. The MEMS comprises structures and corresponding landing pads. Dibs are disposed outwardly from the substrate. Each dib has a surface with depressions. An adherence-reducing material is disposed within each depression. The adherence-reducing material reduces adherence between at least a portion of a structure and a corresponding landing pad.

Certain embodiments of the invention may provide one or more technical advantages. A technical advantage of one embodiment may be that dibs dispense adherence-reducing material to a MEMS device. The adherence-reducing material may include a passivant, surfactant, and/or getter.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 3 illustrates an example of a method for forming dibs; and

FIG. 4 illustrates an example of a method for placing dibs in a package element.

DETAILED DESCRIPTION OF THE DRAWINGS

Figure 2:
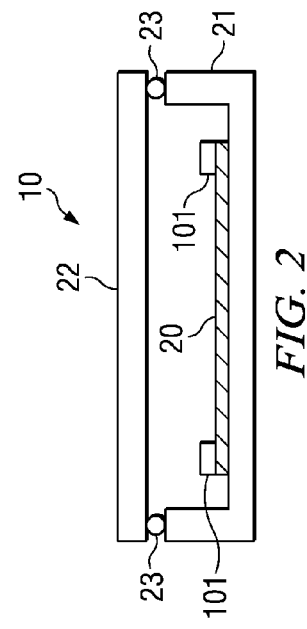
FIG. 2 illustrates a cross-section of an example of a DMD package.
Figure 1:
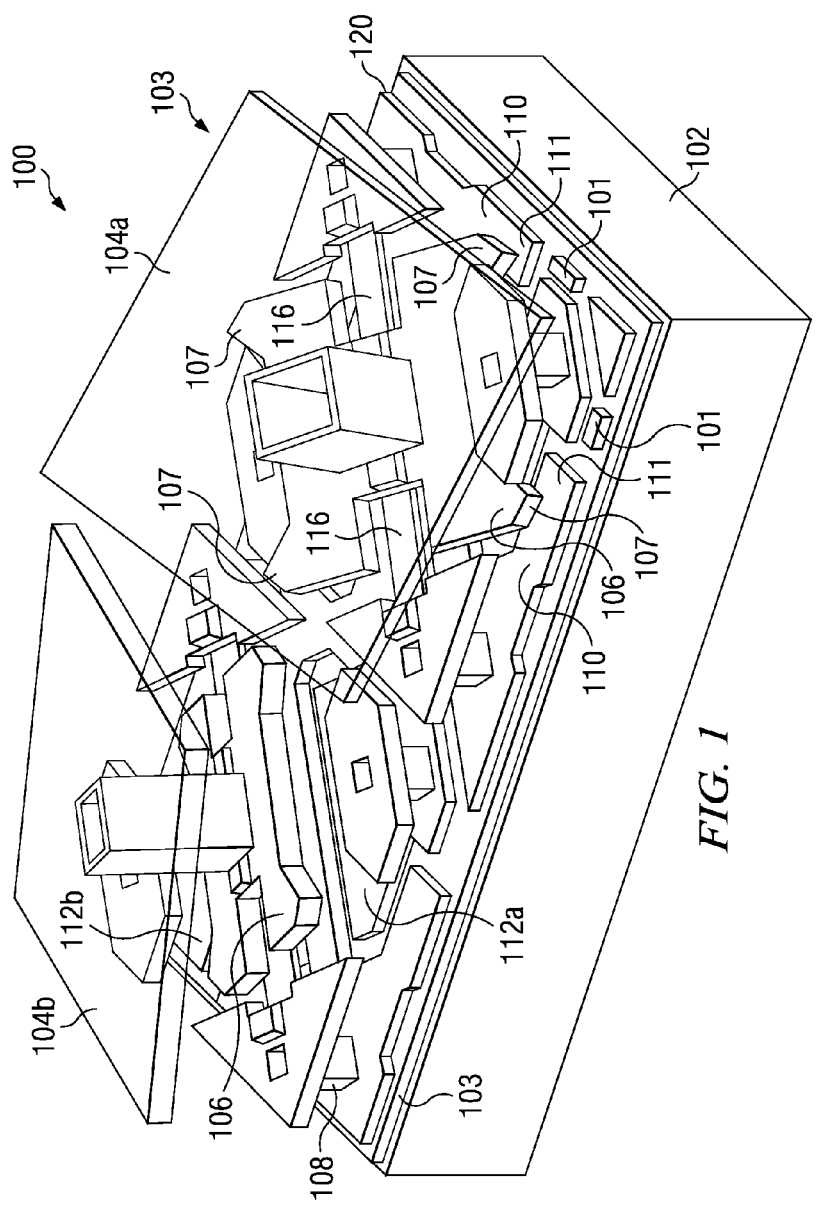
FIG. 1 illustrates a perspective view of an example of a portion of a micro-electromechanical system (MEMS) device.

Embodiments of the present invention and its advantages are best understood by referring to FIGS. 1 through 3 of the drawings, like numerals being used for like and corresponding parts of the various drawings.

FIG. 1 illustrates a perspective view of an example of a portion 100 of a micro-electromechanical system (MEMS) device that comprises a digital micromirror device (DMD). A DMD may have an array of hundreds of thousands of movable structures 103 that include mirrors that move to reflect light. MEMS portion 100 includes dibs 101 that dispense adherence-reducing material to aid the movement of the movable structures 103.

MEMS portion 100 may include a portion of any suitable MEMS device, such as a DMD, a sensor, a controller, or an analyzer. In the illustrated example, MEMS portion 100 includes a substrate 102 with an insulating layer 103 disposed outwardly from substrate 102. A conductive layer 120 is disposed outwardly from insulating layer 103. Conductive layer 120 includes conductive conduits 110 (with landing pads 111) and electrodes 112 coupled as shown. A movable structure 103 is disposed outwardly from substrate 102. Movable structure 103 includes posts 108, yoke 106 (with yoke tips 107), a hinge 116, and a micromirror 104 coupled as shown.

In one embodiment, substrate 102 may comprise a semiconductor substrate such as a complementary metal-oxide semiconductor (CMOS) substrate. Insulating layer 103 operates to insulate substrate 102 from electrodes 112 and conductive conduits 110, and may comprise an oxide. Conductive layer 120 operates as a conductor, and may comprise an aluminum alloy or other suitable conductive material. Electrodes 112 and conductive conduits 110 are formed within conductive layer 120.

Movable structure 103 moves to selectively reflect light. A micromirror 104 comprises a reflective surface of any suitable size and shape. In one embodiment, micromirror 104 has a square shape with a length of less than 20, 17, 13, or 10 microns. Posts 108 support hinge 116, which moves to tilt micromirror 104 to an "on" or "off" state to selectively reflect light. Micromirror 104 may tilt up to plus or minus less than 8, 10, or more than 12 degrees.

In this example, micromirrors 104 tilt in the positive or negative direction until yoke tip 107 of yoke 106 comes in contact with landing pad (or area) 111 of conductive conduits 110. In other examples, yoke 106 may be eliminated. In these examples, micromirrors 104 tilt in the positive or negative direction until micromirrors 104 contact landing pad 111.

In operation, conductive layer 120 receives a bias voltage that at least partially contributes to creation of electrostatic forces between electrodes 112, micromirrors 104, and/or yoke 106. The electrostatic forces cause movable structure 103 to rotate on the axis defined by hinge 116. The movement stops when a part of movable structure 103 touches an obstruction, such as when yoke tips 107 touch landing pad 111.

If the part of movable structure 103 sticks to the obstruction, micromirror 104 may not be able to move when required, thus resulting in faulty operation. To prevent sticking, dibs 102 are disposed outwardly from substrate 102, for example, outwardly from insulating layer 103. Dibs 102 are used control the chemical ambient around a MEMS. A dib 102 has a surface with a plurality of depressions (or indentations). An adherence-reducing material is disposed within depressions. The adherence-reducing material reduces adherence of surfaces by reducing electrostatic, physical, and/or chemical attractions to one or both surfaces. The adherence-reducing material may reduce adherence of structures, such as between a moving or movable structure and a stationary structure or between two moving or movable structures. Dibs 102 may perform the same or different functions.

The adherence-reducing material may comprise a passivant, surfactant, getter, and/or other material that reduces adherence. A passivant operates as a lubricant for a surface. A passivant may lubricate a portion of movable structure 103 and/or landing pad 111. A surfactant may modify the surface energy, for example, lower the surface energy of a material. A surfactant may be added to a passivant to reduce the surface energy of the passivant. A getter operates as a desiccant to reduce moisture proximate to a surface, which may reduce adherence to the surface.

Modifications, additions, or omissions may be made to portion 100 without departing from the scope of the invention. The components of portion 100 may be integrated or separated. Moreover, the operations of portion 100 may be performed by more, fewer, or other components. Additionally, operations of portion 100 may be performed using any suitable logic comprising software, hardware, and/or other logic. As used in this document, "each" refers to each member of a set or each member of a subset of a set.

FIG. 2 illustrates a cross-section of an example of a DMD package 10. In general, examples of DMD packages include ceramic, interposer, lid, and window packages. In the illustrated example, DMD package 10 includes a DMD device 20 mounted in a package body 21. An optical window 22 may be sealed to package body 21 in any suitable manner, for example, with an O-ring 23 and/or by gluing, fusing, centering, and/or welding. Dibs 101 are disposed outwardly from substrate 102 of DMD device 20.

FIG. 3 illustrates an example of a method for forming dibs 101. The method begins with a wafer 210. Wafer 210 represents any suitable substantially flat object having a surface into which depressions may be formed. Wafer 210 may be a semiconductor, dielectric, or conductive wafer that comprises a semiconductive, dielectric, or conductive material, for example, silicon, silica, or aluminum. The wafer material may comprise solid and/or glassy compounds, such as inorganic or organic compounds. In one example, wafer 210 may be formed from the wafer material. In another example, the wafer may be formed by depositing (such as physically or chemically) a layer of the wafer material outwardly from a substrate. In yet another example, the wafer may be processed by depositing and annealing a sol-gel layer outwardly from a substrate.

At step 214, depressions are formed in wafer 210 to yield a porous wafer 214 with a high surface area. A depression may refer to a surface feature of any suitable size or shape that can hold liquid material such as an adherence-reducing material. A depression may have a size in the range of 3 angstroms to 20 millimeters. A depression may have any suitable geometric shape, for example, cylindrical, spherical, rectangular, or linear. Examples of depressions include pores, channels, holes, troughs, or vias.

The depressions of the wafer surface may be formed in any suitable mechanical, electrical, electrochemical, and/or chemical processes. For example, depressions may be formed using etching, electrolysis, electrostatic discharges, ion beam deposition, ion beam milling, neutral beam deposition, and/or milling processes, and/or any of these processes combined with a photolithography process.

Porous wafer 218 is diced to form diced wafer 224. Wafer 218 may be diced in any suitable manner. For example, wafer 218 may be diced by slicing wafer 218 with a blade. Portions of diced wafer 224 is separated to form individual dibs 232 at step 228.

FIG. 4 illustrates an example of a method for placing dibs 101 in a package element. In the example, dibs 101 are placed outwardly from substrate 102 of a package element at step 236 to yield a dibbed package element 240. Dibs 101 may be placed proximate to the perimeter of substrate 102. For example, dibs 101 may be placed at the corners of substrate 102. Dibs may be attached to substrate 102 using a die attach epoxy.

Dibbed package element 240 is saturated with an adherence-reducing material at step 244 to yield saturated dibbed package element 248. The adherence-reducing material may comprise a passivant, surfactant, and/or getter. Saturated dibs 101 may dispense the adherence-reducing material to reduce adherence of at least a portion of movable structure 103 to landing pad 111. Saturated dibbed package element 248 is assembled at step 252 to yield package 256.

Modifications, additions, or omissions may be made to the methods without departing from the scope of the invention. The method may include more, fewer, or other steps. Additionally, steps may be performed in any suitable order.

Certain embodiments of the invention may provide one or more technical advantages. A technical advantage of one embodiment may be that dibs dispense adherence-reducing material to a MEMS device. The adherence-reducing material may include a passivant, surfactant, and/or getter. The dibs may have the same or different functions.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. A method, comprising:
   forming a plurality of indentations in a surface of a wafer;
   forming a plurality of dibs from the wafer;
   disposing the plurality of dibs outwardly from a substrate;
   saturating the plurality of dibs with an adherence-reducing material to dispose the adherence-reducing material within the plurality of indentations; and
   disposing a micro-electromechanical system (MEMS) device outwardly from the substrate, the MEMS device comprising a plurality of structures and a plurality of corresponding landing areas, the adherence-reducing material operable to reduce adherence between at least a portion of a structure and a corresponding landing area.

2. The method of claim 1, the forming the plurality of indentations in the surface of the wafer further comprising:
   etching the wafer to form the plurality of indentations.

3. The method of claim 1, the saturating the plurality of dibs with the adherence-reducing material further comprising:

saturating the plurality of dibs with the adherence-reducing material.

4. The method of claim 1, the forming the plurality of dibs from the wafer further comprising:

dicing the wafer to form the plurality of dibs from the saturated wafer.

5. The method of claim 1, the disposing the plurality of dibs outwardly from a substrate further comprising:

attaching the plurality of dibs to the substrate with a die attach epoxy.

6. The method of claim 1, the adherence-reducing material comprising a passivant operable to lubricate at least one of the structure or the corresponding landing area.

7. The method of claim 1, the adherence-reducing material comprising a surfactant operable to reduce a surface energy of at least one of the structure or the corresponding landing area.

8. The method of claim 1, the adherence-reducing material comprising a getter operable to reduce moisture of at least one of the structure or the corresponding landing area.

9. The method of claim 1, the each dib comprising at least one of a semiconductive, insulating, or conductive material.

* * * * *